United States Patent
Zhang

(10) Patent No.: US 11,057,587 B2
(45) Date of Patent: Jul. 6, 2021

(54) COMPOSITING VIDEO SIGNALS AND STRIPPING COMPOSITE VIDEO SIGNAL

(71) Applicant: HANGZHOU HIKVISION DIGITAL TECHNOLOGY CO., LTD., Hangzhou (CN)

(72) Inventor: Hailong Zhang, Hangzhou (CN)

(73) Assignee: HANGZHOU HIKVISION DIGITAL TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 16/964,903

(22) PCT Filed: Jan. 23, 2019

(86) PCT No.: PCT/CN2019/072752
§ 371 (c)(1),
(2) Date: Jul. 24, 2020

(87) PCT Pub. No.: WO2019/144872
PCT Pub. Date: Aug. 1, 2019

(65) Prior Publication Data
US 2021/0037208 A1   Feb. 4, 2021

(30) Foreign Application Priority Data

Jan. 24, 2018   (CN) .......................... 201810067579.1

(51) Int. Cl.
*H04N 7/08* (2006.01)
*H03M 1/12* (2006.01)
(Continued)

(52) U.S. Cl.
CPC ............ *H04N 7/0806* (2013.01); *H03M 1/12* (2013.01); *H04N 5/40* (2013.01); *H04N 21/2365* (2013.01); *H04N 21/2383* (2013.01)

(58) Field of Classification Search
CPC .... H04N 7/0806; H04N 5/40; H04N 21/2365; H04N 21/2383; H04N 21/234381; H04N 9/808; H03M 1/12
See application file for complete search history.

(56) References Cited

U.S. PATENT DOCUMENTS 5,724,091 A * 3/1998 Freeman ............... H04N 21/426
                                                      725/138
5,898,396 A    4/1999 Shimomura et al.
(Continued)

FOREIGN PATENT DOCUMENTS

CN         1828570      9/2006
CN       101969550      2/2011
(Continued)

OTHER PUBLICATIONS

ISA State Intellectual Property Office of the People's Republic of China, International Search Report Issued in Application No. PCT/CN2019/072752, dated Apr. 10, 2019, 7 pages (with English translation).
(Continued)

*Primary Examiner* — Michael E Teitelbaum
(74) *Attorney, Agent, or Firm* — Fish & Richardson P.C.

(57) ABSTRACT

A method of compositing video signals includes: obtaining at least two video signals to be composited; determining a multiplier point mode corresponding to each of the at least two video signals; performing a byte size adjustment on the at least two video signals respectively according to the multiplier point mode corresponding to each of the at least two video signals; performing a composite modulation on bytes corresponding to the at least two video signals after the byte size adjustment, and outputting composite-modulated data through a target signal interface of an analog-to-digital conversion chip.

18 Claims, 4 Drawing Sheets

(51) Int. Cl.
*H04N 5/40* (2006.01)
*H04N 21/2365* (2011.01)
*H04N 21/2383* (2011.01)

(56) References Cited

U.S. PATENT DOCUMENTS

| | | | |
|---|---|---|---|
| 6,546,063 B1* | 4/2003 | Lee | H04L 25/03885 |
| | | | 375/232 |
| 7,804,852 B1 | 9/2010 | Durham et al. | |
| 2002/0093710 A1 | 7/2002 | Birk et al. | |
| 2008/0056357 A1* | 3/2008 | Chan | H03M 1/1265 |
| | | | 375/240.12 |
| 2013/0070262 A1 | 3/2013 | Konno et al. | |
| 2016/0285619 A1* | 9/2016 | Mai | H03L 7/0996 |

FOREIGN PATENT DOCUMENTS

| | | |
|---|---|---|
| CN | 102663987 | 9/2012 |
| CN | 102740061 | 10/2012 |
| CN | 103973582 | 8/2014 |
| CN | 104301653 | 1/2015 |
| CN | 106303486 | 1/2017 |
| CN | 107277595 | 10/2017 |
| CN | 107360388 | 11/2017 |
| JP | 2006211534 | 8/2006 |
| WO | WO2008028143 | 3/2008 |

OTHER PUBLICATIONS

ISA State Intellectual Property Office of the People's Republic of China, International Written Opinion Issued in Application No. PCT/CN2019/072752, dated Apr. 10, 2019, 6 pages (with English translation).

State Intellectual Property Office of the People's Republic of China, Office Action and Search Report Issued in Application No. 2018100675791, dated Dec. 10, 2019, 10 pages (with Machine Translation).

IEEE Std 1241-2000, "IEEE Standard for Terminology and Test Methods for Analog-to-Digital Converters", X017603470, ISBN: 978-0-7381-2724-8, Jan. 1, 2001, 98 pages.

European Extended European Search Report Issued in European Application No. 19743224.8 dated Aug. 21, 2020, 11 pages.

Itu.int [online], "Recommendation ITU-R BT.656-4 : Interfaces for digital component video signals in 525-line and 625-line television systems operating at the 4:2:2 level of Recommendation ITU-R BT.601", Feb. 1998, [retrieved on Nov. 6, 2020], Retrieved from: URL <http://www.itu.int/rec/R-REC-BT.656-4-199802-S/dologin_pub.asp?lang=e&id=R-REC-BT.656-4-199802-S!!PDF-E&type=items>, 16 pages.

ti.com [online], "LMH1983 3G/HD/SD Video Clock Generator with Audio Clock", Dec. 2014, [retrieved on Nov. 6, 2020], Retrieved from: URL <https://www.ti.com/lit/ds/symlink/lmh1983.pdf?ts=1597227700011&ref_url=https%253A%252F%252Fwww.google.com%252F>, 55 pages.

Training.TI.com [online], "Understanding Sampling rate vs Data rate: Decimation (DDC) and Interpolation (DUC) Concepts",Dec. 2017, [retrieved on Nov. 6, 2020], Retrieved from: URL <https://training.ti.com/sites/default/files/docs/TIPL%204701%20-%20Sampling%20ra te%20vs%20Data%20rate%2C%20concept%20of%20decimation%20DDC%20and%20interpolation%20DUC.pdf>, 23 pages.

* cited by examiner

COMPOSITING VIDEO SIGNALS AND STRIPPING COMPOSITE VIDEO SIGNAL

CROSS REFERENCE TO RELATED APPLICATIONS

This patent application is a national stage application of International Application No. PCT/CN2019/072752, filed on Jan. 23, 2019, which claims priority to Chinese Patent Application No. 201810067579.1, entitled "a method and apparatus for compositing video signals, and an electronic device", filed on Jan. 24, 2018, the entire contents of which are incorporated herein by reference.

TECHNICAL FIELD

The present disclosure relates to the field of video signal transmission, and in particular, to a method and apparatus for compositing video signals, and an electronic device.

BACKGROUND

Digital signal transmission protocols such as BT656 and BT1120 define a parallel hardware interface for transmitting digital video streams in a data format of YCbCr. That is, each pixel uses one luminance component Y, and even two pixels share two chrominance components Cb and Cr. In addition, sampling modes stipulated by digital signal transmission protocols such as BT656 and BT1120 include a single-edge sampling mode and a double-edge sampling mode, and their data bit width is in a 8-bit mode (BT1120 also has a 16-bit mode). The so-called 8-bit mode specifically refers to that rising and/or falling edge sampling is performed each time, a data amount of 8 bits, i.e., 1 byte, is captured.

SUMMARY

Some examples of the present disclosure provide a method of stripping a composite video signal to effectively separate a composite video signal transmitted through an interface for transmitting digital video streams, for example, in a data format of YCbCr.

The present disclosure is achieved by the following technical solutions.

In a first aspect, some examples of the present disclosure provide a method of compositing video signals, which is applied to an analog-to-digital conversion chip in an electronic device. The analog-to-digital conversion chip is configured with a target signal interface. The target signal interface is configured for transmitting digital video streams. A working clock frequency of the target signal interface is a predetermined clock frequency. A target byte size is single-edge sampled at the predetermined clock frequency. The method includes: obtaining at least two video signals to be composited; determining a multiplier point mode corresponding to each of the at least two video signals, wherein a multiplier point mode corresponding to each of the video signals enables the video signal to have a target byte size within a unit time duration; performing a byte size adjustment on the at least two video signals respectively according to the multiplier point mode corresponding to each of the at least two video signals to obtain at least two video signals after the byte size adjustment; performing a composite modulation on bytes corresponding to the at least two video signals after the byte size adjustment to obtain composite-modulated data, and outputting the data through the target signal interface of the analog-to-digital conversion chip.

In an example, performing a composite modulation on the bytes corresponding to the at least two video signals after the byte size adjustment includes: modulating bytes corresponding to at least one of the at least two video signals after the byte size adjustment at a clock rising edge, and adding a first display channel identifier to an effective start bit at the clock rising edge, wherein the first display channel identifier a display channel identifier corresponding to the video signal modulated at the clock rising edge; modulating respective bytes corresponding to at least one of the at least two video signals after the byte size adjustment at a clock falling edge, and adding a second display channel identifier to an effective start bit at the clock falling edge, wherein the second display channel identifier is a display channel identifier corresponding to the video signal modulated at the clock falling edge.

In an example, determining the multiplier point mode corresponding to each of the at least two video signals includes: obtaining the multiplier point mode corresponding to each of the at least two video signals based on a signal format corresponding to each of the at least two video signals.

In an example, the at least two video signals to be composited include two video signals. The two video signals are a video signal in a 1080P25/30 fps format and a video signal in a 720P25/30 fps format, a multiplier point mode corresponding to the video signal in the 1080P25/30 fps format is a one-fold multiplier point, and a multiplier point mode corresponding to the video signal in the 720P25/30 fps format is a two-fold multiplier point; or the two video signals are a video signal in a 1080P25/30 fps format and a video signal in a WD1-NTSC/PAL format, a multiplier point mode corresponding to the video signal in the 1080P25/30 fps format one-fold multiplier point, and a multiplier point mode corresponding to the video signal in the WD1-NTSC/PAL format is a four-fold multiplier point; or the two video signals are a video signal in a 720P25/30 fps format and a video signal in a WD1-NTSC/PAL format, a multiplier point mode corresponding to the video signal in the 720P25/30 fps format is a two-fold multiplier point, and a multiplier point mode corresponding to the video signal in the WD1-NTSC/PAL format is a four-fold multiplier point.

In an example, the target signal interface is a BT656 interface or a BT1120 interface.

In an example, in the at least two video signals after the byte size adjustment, at least one video signal is modulated at a clock rising edge, and at least one video signal is modulated at a clock falling edge; or the at least two video signals are alternately modulated at a clock rising edge; or the at least two video signals are alternately modulated at a clock falling edge.

In a second aspect, some examples of the present disclosure provide a method of stripping a composite video signal, which is applied to a system-on-chip (SOC) chip in an electronic device. The SOC chip is configured with a target signal interface. The target signal interface is configured for transmitting digital video streams. A working clock frequency of the target signal interface is a predetermined clock frequency. A target byte size is single-edge sampled at the predetermined clock frequency. The method includes: receiving composite-modulated data through the target signal interface of the SOC chip, wherein the composite modulated data is obtained by performing a composite modulation on at least two video signals; sampling, in manner of single-edge or double-edge, the composite-modulated data to obtain at least two video signals after the byte size adjustment; determining a multiplier point mode corresponding to each of the at least two video signals after the byte size adjustment; performing signal stripping on the at least two video signals after the byte size adjustment according to the multiplier point mode corresponding to each thereof to obtain at least two video signals before the byte size adjustment.

In an example, determining the multiplier point mode corresponding to each of the at least video signals after the byte size adjustment includes: obtaining a first display channel identifier from an effective start bit at a clock rising edge, and obtaining a second display channel identifier from an effective start bit at a clock falling edge; reading a first signal format corresponding to a display channel with the first display channel identifier and a second signal format corresponding to a display channel with the second display channel identifier from a register of an analog-to-digital conversion chip; determining, based on the first signal format, a multiplier point mode corresponding to a video signal sampled from the clock rising edge; and determining, based on the second signal format, a multiplier point mode corresponding to a video signal sampled from the clock falling edge.

In a third aspect, some examples of the present disclosure provide an apparatus for compositing video signals, which is applied to an analog-to-digital conversion chip in an electronic device. The analog-to-digital conversion chip is configured with a target signal interface. The target signal interface is configured for transmitting digital video streams. A working clock frequency of the target signal interface is a predetermined clock frequency. A target byte size is single-edge sampled at the predetermined clock frequency. The apparatus includes: a video signal obtainer configured to obtain at least two video signals to be composited; a multiplier point mode determiner configured to determine a multiplier point mode corresponding to each of the at least two video signals, wherein a multiplier point mode corresponding to at least one of the at least two video signals enables the at least one video signal to have a target byte size within a unit time duration; a byte size adjuster configured to perform a byte size adjustment on the at least two video signals respectively according to the multiplier point mode corresponding to each of the at least two video signals to obtain at least two video signals after the byte size adjustment; and a modulation processor configured to perform a composite modulation on bytes corresponding to the at least two video signals after the byte size adjustment to obtain composite-modulated data, and output the data through the target signal interface of the analog-to-digital conversion chip.

In an example, the modulation processor is configured to: modulate respective bytes corresponding to at least one of the at least two video signals after the byte size adjustment at a clock rising edge, and add a first display channel identifier to an effective start bit at the clock rising edge, wherein the first display channel identifier is a display channel identifier corresponding to the video signal modulated at the clock rising edge; modulate bytes corresponding to at least one of the at least two video signals after the byte size adjustment at a clock falling edge, and add a second display channel identifier to an effective start bit at the clock falling edge, wherein the second display channel identifier is a display channel identifier corresponding to the video signal modulated at the clock falling edge.

In an example, the multiplier point node determiner is configured to: obtain the multiplier point mode corresponding to each of the at least two video signals based on a signal format corresponding to each of the at least two video signals.

In a fourth aspect, some examples of the present disclosure provide an apparatus for stripping a composite video signal, which is applied in a system-on-chip (SOC) chip in an electronic device. The SOC chip is configured with a target signal interface. The target signal interface is configured for transmitting digital video streams. A working clock frequency of the target signal interface is a predetermined clock frequency. A target byte size is single-edge sampled at the predetermined clock frequency. The apparatus includes a data receiver, a sampler, a multiplier point mode determiner and a signal stripper.

The data receiver is configured to receive composite-modulated data through the target signal interface of the SOC chip, wherein the composite-modulated data is obtained after an analog-to-digital conversion chip in the electronic device performs a composite modulation on at least two video signals using the method of compositing the video signals according to the first aspect;

The sampler is configured to single-edge or double-edge sample the composite-modulated data to obtain at least two video signals after a byte size adjustment;

The multiplier point mode determiner is configured to determine a multiplier point mode corresponding to each of the at least two video signals after the byte size adjustment; and The signal stripper is configured to signal stripping on the at least two video signals after the byte size adjustment according multiplier point mode corresponding to each thereof to obtain at least two video signals before the byte size adjustment.

In an example, the multiplier point mode determiner is configured to: obtain a first display channel identifier from an effective start bit at a clock rising edge, and obtain a second display channel identifier from an effective start bit at a clock falling edge; read a first signal format corresponding to a display channel with the first display channel identifier and a second signal format corresponding to a display channel with the second display channel identifier from a register of an analog-to-digital conversion chip; determine, based on the first signal format, a multiplier point mode corresponding to a video signal sampled from the clock rising edge; and determine, based on the second signal format, a multiplier point mode corresponding to a video signal sampled from the clock falling edge.

In a fifth aspect, some examples of the present disclosure provide an electronic device, including: an analog-to-digital conversion chip and a system-on-chip (SOC) chip. The analog-to-digital conversion chip and the SOC chip are configured with a target signal interface. The target interface is configured for transmitting digital video streams. A working clock frequency of the target signal interface is a predetermined clock frequency. A target byte size is single-edge sampled at the predetermined clock frequency. The analog-to-digital conversion chip is configured to obtain at least two video signals to be composited, determine a multiplier point mode corresponding to each of the at least two video signals, wherein a multiplier point mode corresponding to any video signal enables the video signal to have a target byte size within a unit time duration, perform a byte size adjustment on the at least two video signals respectively according to the multiplier point mode corresponding to each of the at least two video signals, and perform a composite modulation on bytes corresponding to at least two video signals after the byte size adjustment, and output composite-modulated data to the system-on-chip SOC chip through its own target signal interface. The SOC chip is configured to receive the composite-modulated data through its own target signal interface, single edge or double-edge sample the composite-modulated data to obtain the at least two video signals after the byte size adjustment, determine a multiplier point mode corresponding to each of the at least two video signals after the byte size adjustment, and perform signal stripping on the at least two video signals after the byte size adjustment according to the multiplier point mode corresponding to each thereof to obtain at least two video signals before the byte size adjustment.

In the method of compositing the video signals provided by some examples of the present disclosure, the byte size adjustment is performed on the at least two video signals to be composited respectively according to the multiplier point mode corresponding to each of the at least two video signals, so that data amounts of the at least two video signals conform to sampled data amounts corresponding to the working clock frequency of the target signal interface. The bytes corresponding to the at least two video signals after the byte size adjustment are compositely modulated, and the composite-modulated data is output to the SOC chip through its own target signal interface, so that simultaneous transmission is achieved. Therefore, this method can solve the problem that the interface for transmitting the digital video streams, for example, in a data format of YCbCr, cannot simultaneously transmit video signals with different clock frequencies in the related art, improving the flexibility of video signal transmission.

In the method of stripping the composite video signal provided by some examples of the present disclosure, the composite-modulated data received through the target signal interface is single-edge or double-edge sampled, the signal stripping is performed on the at least two video signals after the byte size adjustment according to the multiplier point mode corresponding to each thereof, to restore the video signals before the byte size adjustment. Therefore, this method can effectively separate the composite video signal transmitted through the interface for transmitting the digital video streams.

DETAILED DESCRIPTION

Figure 1A:
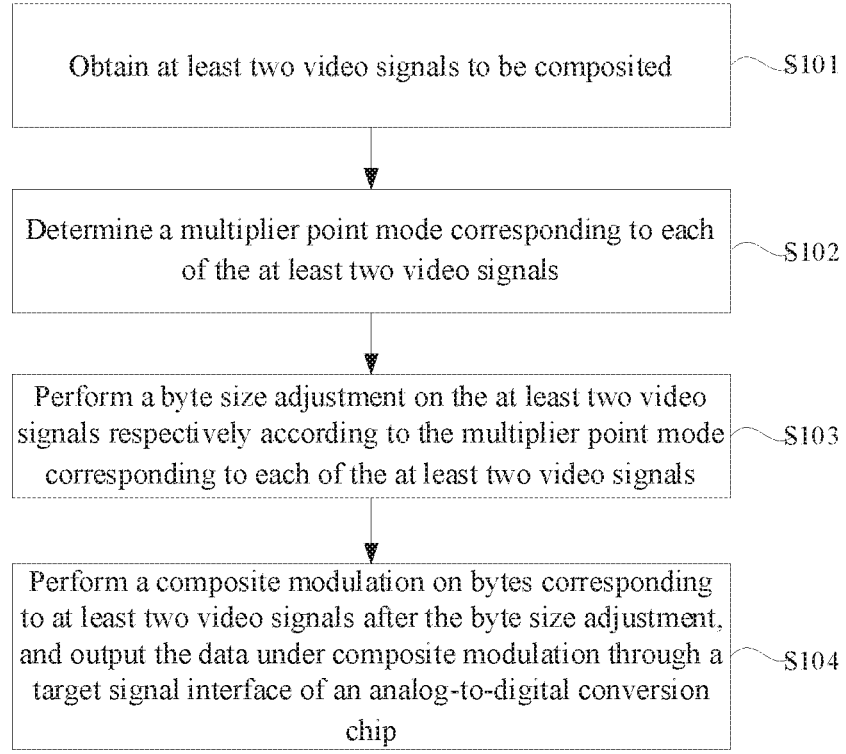
FIG. 1 is a flowchart illustrating a method a compositing video signals according to an example of the present disclosure.
FIG. 1B is a flowchart illustrating a method of compositing video signals according to an example of the present disclosure.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular examples only, and are not intended to limit the present disclosure. Terms determined by "a", "the" and "said" in their singular forms in the present disclosure and the appended claims are also intended to include plurality, unless clearly indicated otherwise in the context. It should also be understood that the term "and/or" as used herein refers to and includes any and all possible combinations of one or more of the associated listed items.

It is to be understood that, although terms "first," "second," "third," and the like may be used in the present disclosure to describe various information, such information should not be limited to these terms. These terms are only used to distinguish one category of information from another. For example, without departing from the scope of the present disclosure, first information may be referred as second information; and similarly, second information may also be referred as first information. Depending on the context, the word "if" as used herein may be interpreted as "when" or "upon" or "in response to determining".

In order to facilitate the understanding of solutions, basic concept information is introduced below.

Firstly, digital signal transmission protocols such as BT656 and BT1120 stipulate that video signals are transmitted in a data format of YCbCr. That is, each pixel uses one luminance component Y, and every two pixels share two chrominance components Cb and Cr. With 1, 2, 3 and 4 representing the first, second, third and fourth pixels respectively, a data transmission order is as follows: Cr1 Y1 Cr1 Y2 Cb2 Y3 Cr2 Y4 . . . , and so on.

Based on the above composition structure, the first pixel is composed of if Y1Cb1Cr1, the second pixel is composed of Y2Cb1Cr1, the third pixel is composed of Y3Cb2Cr2, the fourth pixel is composed of Y4Cb2Cr2, and so on.

Secondly, an equation for calculating the total a amount of signals for video signals (i.e., the byte size within a unit time duration) is:

$$\text{total data amount of signals} = \text{total number of row points} * \text{total number of rows} * \text{frame rate of signals} * 2 \quad \text{(Equation 1)}$$

Where, the total number of row points is the total pixels in each row, including the number of valid pixels and the number of invalid pixels; the total number of rows includes valid and invalid rows; and the frame rate of signals is the number of frames per second, for example, the frame rate of 1080P30 fps signals is 30 frames per second. When transmission is performed in a data format of YCbCr, each pixel occupies two bytes, and therefore, multiplication by 2 is finally required in the equation of the total data amount of signals.

Thirdly, signal transmission scenarios to which some examples of the present disclosure are applicable are as follows.

A video capturing device, after capturing a video signal, converts the captured video signal into an analog signal, and transmits the analog signal to a back-end server. Correspondingly, an analog-to-digital conversion chip in the back-end server, after converting the received analog signal into a video signal, modulates the video signal, that is, modulates bytes of the video signal at a clock rising edge or a clock falling edge, and transmits the modulated data to an SOC (System On a Chip) chip of the back-end server through target signal interface of the analog-to-digital conversion chip. The SOC chip, after receiving the modulated data through its own target signal interface, samples the video signal from the modulated data, and then transmits the video signal to a corresponding display channel so as to display through a display device corresponding to the display channel. Different display channels may correspond to different display devices or the same display device. The SOC chip is a system-level chip, and specifically refers to a circuit that realizes, on a single silicon chip, the functions of signal capturing, conversion, storage, processing, input and output (I/O), etc that a system has. The target signal interface is an interface for transmitting digital video streams, for example, in a data format of YCbCr. In specific applications, the target signal interface may be a BT656 interface or a BT1120 interface, and it is not limited thereto.

In the related art, for signal interfaces such as the BT656 interface and the BT1120 interface, one, two or four video signals with the same clock frequency (i.e., the same byte size within a unit time duration) may be transmitted, but signals with different clock frequencies cannot be transmitted simultaneously, so that the flexibility of video signal transmission is poor. For example, in the related art, the BT656 interface cannot simultaneously transmit any two of composite video broadcast signals (CVBS), 720P and 1080P signals.

In order to solve the above problems, the present disclosure provides a method and apparatus for compositing video signals, and an electronic device.

In the first aspect, some examples of the present disclosure provide a method of compositing video signals to solve the problem that an interface for transmitting digital video streams cannot simultaneously transmit video signals with different clock frequencies in the related art, improving the flexibility of video signal transmission.

In some examples of the present disclosure, the method of compositing the video signals is provided, which may be applied to an analog-to-digital conversion chip in an electronic device. The analog-to-digital conversion chip is a chip for realizing the function of analog-to-digital conversion. The analog-to-digital conversion chip is configured with a target signal interface. The target signal interface is an interface for transmitting digital video streams. The digital video streams may have a data format of YCbCr. A working clock frequency of the target interface is a predetermined clock frequency. A target byte size is single-edge sampled, for example, falling single-edge sampled or rising single-edge sampled, at the predetermined clock frequency. In specific applications, the electronic device may be a back-end server that communicates with a video capturing device, and it is not limited thereto. The target signal interface may be a BT656 interface or a BT1120 interface, and it is not limited thereto.

In an example, the target byte size single-edge sampled at the predetermined clock frequency may be higher than byte sizes of various currently existing video signals within a unit time duration, to ensure that when video signals to be composited are switched from a low data amount to a high data amount, the predetermined clock frequency may still be effective. Based on this requirement, in specific applications, the predetermined clock frequency may be 148.5 MHz, that is, a single-edge sampled data amount is 148.5 MHz, and it is not limited thereto.

As shown in FIG. 1A, some examples of present disclosure provide a method of compositing video signals. The method is applied to an analog-to-digital conversion chip in an electronic device. The analog-to-digital conversion chip is configured with a target signal interface. The target signal interface is an interface for transmitting digital video streams. The method may include the following steps S101 to S104.

At step S101, at least two video signals to be composited are obtained.

In the step S101, before a byte size is adjusted, the byte size of the at least two video signals to be composited within a unit time duration is not higher than the target byte size. Moreover, the analog-to-digital conversion chip may perform analog-to-digital conversion on the at least two analog signals to obtain at least two video signals to be composited. For example, the analog signals may be transmitted by the video capturing device.

At step S102, a multiplier point mode corresponding to each of the at least two video signals is determined.

In the step S102, a multiplier point mode corresponding to any video signal enables the video signal to have a target byte size within a unit time duration.

The basic processing idea of the method of compositing the video signals according to some examples of the present disclosure is that video signals with different clock frequencies are adjusted to conform to a single-edge sampled data amount corresponding to a working clock frequency of the target signal interface, and are then composite transmitted. Therefore, in the data compositing process, it is possible to determine the multiplier point mode corresponding to each of the at least two video signals, and then use the determined multiplier point mode to perform a byte size adjustment on the at least two video signals.

The so-called multiplier point is the number of byte occurrences. Specifically, the multiplier point mode is a one-fold multiplier point, that is, a byte occurs once; the multiplier point mode is a two-fold multiplier point, that is, a byte occurs twice continuously; the multiplier point mode is a four-fold multiplier point, that is, a byte occurs four times continuously, and so on.

In an example, the multiplier point mode corresponding to each of the at least two video signals may be obtained based on signal formats corresponding to the at least two video signals, and it is not limited thereto. Moreover, in specific applications, the correspondence between signal formats and multiplier point modes may be set in advance. Furthermore, after video signals are obtained, multiplier point modes corresponding to the obtained video signals may be determined directly based on the correspondence between the signal formats and the multiplier point modes.

At step S103, a byte size adjustment is performed on the at least two video signals respectively according to the multiplier point mode corresponding to each of the at least two video signals.

After the multiplier point mode corresponding to each of the at least two video signals is determined, the byte size adjustment may be performed on the at least two video signals respectively, so that each video signal after the byte size adjustment conforms to the single-edge sampled data amount corresponding to the working clock frequency of the target signal interface, and then the at least two video signals perform a composite modulation subsequently.

For example, a predetermined clock frequency corresponding to the target signal interface may be 148.5 MHz. In this case, a single-edge data amount is 148.5*1000*1000=148500000, and the unit is byte/second.

Regarding the predetermined clock frequency corresponding to the target signal interface, other frequencies may also be used in the present disclosure. The clock frequency of 148.5 MHz, is used only as an example, and it is not limited thereto. In order to make the solution clear, taking the predetermined clock frequency of 148.5 MHz, the sampling mode of a double-edge sampling mode, and two video signals to be composited as an example, the correspondence between video signals in various formats and byte multiplier point mode will be described as follows.

(1) It is assumed that the two video signals to be composited are one video signal in a format of 1080P25/30 fps 1080P25 fps or 1080P30 fps) and one video signal in a format of 720P25/30 fps (i.e., 720P25 fps or 720P30 fps).

Because 720P25/30 fps, compared with 1080P25/30 fps, has an insufficient data amount, it cannot be directly composited with 1080P25/30 fps, so that a two-fold multiplier point may be made on the 720P25/30 fps to meet the data amount requirement. That is to say, a multiplier point mode corresponding to a video signal in a format of 1080P25/30 fps is a one-fold multiplier point, and a multiplier point mode corresponding to a video signal in a format of 720P25/30 fps is a two-fold multiplier point.

For the 1080P30 fps format, the total number of row points is set to 2200, wherein the number of valid pixels is 1920; the total number of rows is set to 41+1080+4=1125, wherein a valid data row is 1080, which indicates a height of 1080P, and invalid blanking data rows are 41 and 4, which are placed respectively in front of and behind the valid data row. As can be known from the above equation 1, the total data amount of the video signal in a format of 1080P30 fps is:

$$2200*1125*30*2=148500000.$$

That is to say, if the format of the video signal is 1080P30 fps, the multiplier point mode corresponding to the video signal is a one-fold multiplier point.

For the 1080P25 fps format, the total number of row points is set to 2640, where the number of valid pixels is 1920; the total number of rows is 1125, wherein the number of valid rows is 1080. As can be known from the above equation 1, the total data amount of the video signal in a format of 1080P25 fps is:

$$2640*1125*25*2=148500000.$$

That is to say, format of a video signal is 1080P25 fps the multiplier point mode corresponding to the video signal is a one-fold multiplier point.

For the 720P30 fps format, after the two-fold multiplier point is performed, the total number of row points is set to 1650*2=3300, wherein 1280*2=2560 is the number of valid pixels; the total number of rows is 750, wherein the number of valid rows is 720. As can be known from the above equation 1, the total data amount of the video signal in a format of 720P30 fps after the two-fold multiplier point is performed is:

$$3300*750*30*2=148500000.$$

That is to say, if the format of the video signal is 720P30 fps, the multiplier point mode corresponding to the video signal is a two-fold multiplier point.

For the 720P25 fps formal, after the two-fold multiplier point is performed, the total number of row points is set to 1980*2=3960, wherein 1280*2=2560 is the number of valid pixels; the total number of rows is 750, wherein the number of valid rows is 720. As can be known from the above equation 1, the total data amount of the video signal in a format of 720P25 fps after the two-fold multiplier point is performed is:

$$3960*750*25*2=148500000.$$

That is to say, if the format of the video signal is 720P25 fps, the multiplier point mode corresponding to the video signal is a two-fold multiplier point.

In an example of the present disclosure, the byte size may be adjusted in terms of a byte multiplier point mode. The video signal transmitted in a format of 720P25/30 is taken as an example. In a case where a byte order corresponding to four pixels is Cb1 Y1 Cr1 Y2 Cb2 Y3 Cr2 Y4, if the byte order is adjusted according to a two-fold multiplier point of byte, the byte order corresponding to the pixels after the adjustment is: Cr1 Cr1 Y1 Y1 Cr1Cr1 Y2 Y2 Cb2 Cb2 Y3 Y3 Cr2 Cr2 Y4 Y4 . . . , and so on.

In an example of the present disclosure, the byte size may also be adjusted in terms of a pixel multiplier point mode. The video signal transmitted in a format of 720P25/30 is taken as an example. In a case where a byte order corresponding to four pixels is Cr1 Y1 Cr1 Y2 Cb2 Y3 Cr2 Y4, if the byte order is adjusted according to a two-fold multiplier point of pixel, the following two byte-ordering manners may be used to adjust the byte size. In the first manner, the byte order corresponding to the pixels after the adjustment is: Cb1 Y1 Cr1 Y2 Cr1 Y1 Cr1 Y2 Cb2 Y3 Cr2 Y4 Cb2 Y3 Cr2 Y4 . . . , and so on. In the second manner, the byte order corresponding to the pixels after the adjustment is: Cr1 Y1 Cr1 Y1 Cb1 Y2 Cr1 Y2 Cb2 Y3 Cr2 Y3 Cb2 Y4 Cr2 Y4 . . . , and so on.

The mode for adjusting the byte size in the present disclosure is not limited to the byte multiplier point mode and pixel multiplier point mode. Those skilled in the art may select other appropriate multiplier point modes to adjust the byte size according to specific applications and experience, which are not specifically limited in the present disclosure.

(2) It is assumed that the two video signals to be composited are one video signal in a format of 1080P25/30 fps and one video signal in a format of WD1-NTSC/PAL, (i.e., WD1-NTSC or WD1-PAL).

Because WD1-NTSC/PAL, compared with 1080P25/30 fps, has an insufficient data amount, it cannot be directly composited with 1080P25/30 fps, so that a four-fold multiplier point may be performed on the WD1-NTSC/PAL to meet the data amount requirement. That is to say, a multiplier point mode corresponding to the video signal in a format of 1080P25/30 fps is a one-fold multiplier point, and a multiplier point mode corresponding to the video signal in a format of WD1-NTSC/PAL is a four-fold multiplier point.

For the WD1-NTSC format, after the four-fold multiplier point is performed, the total number of row points is set to 2376*2=4752, wherein the reason for multiplication by 2 instead of 4 is that the analog-to-digital conversion chip completes a two-fold multiplier point therein, and here multiplication by 2 is enough; 960*4=3840 is the number of valid pixels, wherein the reason for multiplication by 4 is that a four-fold multiplier point is performed in total; and the total number of rows is 625, wherein the number of valid rows is 576. As can be known from the equation 1, the total data amount of the video signal in a format of WD1-NTSC after the four-fold multiplier point is performed is:

$$4752*625*25*2=148500000.$$

That is to say, if the format of the video signal is WD1-NTSC, the multiplier point mode corresponding to the video signal is a four-fold multiplier point.

For the WD1-PAL format, after the four-fold multiplier point is performed, the total number of row points is set to 2360*2=4720, wherein the reason for multiplication by 2 instead of 4 is that the analog-to-digital conversion chip completes a two-fold multiplier point therein, and here multiplication by 2 is enough; 960*4=3840 is the number of valid pixels, wherein the reason for multiplication by 4 is that a four-fold multiplier point is performed in total; and the total number of rows is 525, wherein the number of valid rows is 480. As can be known from the equation 1, the total data amount of the video signal in a format of WD1-PAL after the four-fold multiplier point is performed is:

4720*525*29.97*2=148531320, wherein the total data amount of the signals approximately equal to a clock single-edge data amount of 148.5 MHz to meet the requirement. That is to say, if the format of the video signal is WD1-PAL, the multiplier point mode corresponding to the video signal is a four-fold multiplier point.

In addition, when the video signal is transmitted in a format of WD1-NTSC/PAL, the order of pixels is represented by 1, 2 and 3, and the order before adjust a byte size according to a four-fold multiplier point Cb1 Y1 Cr1 Y2 Cb2 . . . , and so on.

The order after adjusting the byte size according to the four-fold multiplier point is: Cb1 Cb1 Cb1 Cb1 Y1 Y1 Y1 Y1 Cr1 Cr1 Cr1 Cr1 Y2 Y2 Y2 Y2 Cb2 Cb2 Cb2 Cb2 . . . , and so on.

In addition, those skilled in the art may understand that WD1 in a format of WD1-NTSC/PAL is a resolution 960× 576, which is clearer and suitable for widescreens, proposed based on a D1 resolution 704×576; NTSC is an abbreviation of National Television Standards Committee, which means "(United States) National Television Standards Committee", and NTSC is responsible for development of a set of United States standard television broadcast transmission and reception protocols; PAL format is also known as PAL, and PAL is an abbreviation of Phase Alteration Line, which means phase alteration line by line and belongs to a simultaneous format.

(3) It is assumed that the two video signals to be composited are one video signal in a format of 720P25/30 fps and one video signal in a format of WD1-NTSC/PAL:

in order to meet the single-edge data amount corresponding to 148.5 MHz, WD1-NTSC/PAL uses a four-fold multiplier point, and 720P25/30 fps uses a two-fold multiplier point to meet the data amount requirement. That is to say, a multiplier point mode corresponding to the video signal in a format of 720P25/30 fps is a two-fold multiplier point, and a multiplier point mode corresponding to the video signal in a format of WD1-NTSC/PAL is a four-fold multiplier point. For the byte order of the four-fold multiplier point and the two-fold multiplier point, please refer to the ordering manner given in the previous contents, which will not be repeated here.

In addition, it should be emphasized that, when 720P25/30 fps and WD1-NTSC/PAL, are composited, it is theoretically required only to work at a single edge of 148.5 MHz, and perform no multiplier point on 720P25/30 fps and a two-fold multiplier point on WD1-NTSC/PAL. The reason why the examples of the present disclosure still use a double edge of 148.5 MHz is that if the 720P25/30 fps and WD1-NTSC/PAL are composited in the above manner, when 720P25/30 fps or WD1-NTSC/PAL is disconnected, and then 1080P25/30 is connected, it is inaccessible, and it is required to be reset to the double edge of 148.5 MHz for access, but this operation will affect the two video signals, resulting in a black screen for a period of time, and poor and inflexible effect.

For video signals with the same clock frequency, signals may be composited through a multiplier point mode. In an example, for the video signals with the same clock frequency, two video signals correspond to the same multiplier point mode. For example, when the predetermined clock frequency is 148.5 MHz and the sampling mode is a double-edge sampling mode, if two video signals to be composited are one video signal in a format of 1080P25 fps and one video signal in a format of 1080P30 fps, a multiplier point mode corresponding to the two video signals is a one-fold multiplier point. For another example, when the predetermined clock frequency is 148.5 MHz and the sampling mode is a double-edge sampling mode, if two video signals to be composited are one video signal in a format of 720P25 fps and one video signal in a format of 720P30 fps, a multiplier point mode corresponding to the two video signals is a two-fold multiplier point. For another example, when the predetermined clock frequency is 148.5 MHz and the sampling mode is a double-edge sampling mode, if two video signals to be composited are the video signal in a format of WD1-NTSC and the video signal in a format of WD1-PAL, a multiplier point mode corresponding to the two video signals is a four-fold multiplier point.

At step S104, composite modulation is performed on bytes corresponding to at least two video signals after the byte size adjustment, and composite-modulated data is output through the target signal interface of the analog-to-digital conversion chip.

In the step S104, when a double-edge sampling mode is used, in the at least two video signals after the byte size adjustment, at least one video signal is modulated at a clock rising edge and at least one video signal is modulated at a clock falling edge. As an example, when the at least two video signals include four video signals, two of the four video signals are modulated at the clock rising edge, and the other two of the four video signals are modulated at the clock falling edge. For example, the first and second video signals are modulated at the clock rising edge, and the third and fourth video signals are modulated at the clock falling edge.

In an example, when a single-edge sampling mode, for example, a rising edge sampling mode, is used, the at least two video signals may be alternately modulated at the clock rising edges. For example, when the at least two video signals include four video signals, the four video signals are alternately modulated at the clock rising edge. For example, the first video signal is modulated at the first clock rising edge, the second video signal is modulated at the second clock rising edge, the third video signal is modulated at the third clock rising edge, the fourth video signal is modulated at the fourth clock rising edge, the first video signal is modulated at the fifth clock rising edge . . . , and so on.

In an example, when a single-edge sampling mode, for example, a falling edge sampling mode, is used, the at least two video signals may be alternately modulated at the clock falling edges. For example, when the at least two video signals are specifically four video signals, the four video signals are alternately modulated at the clock falling edge. For example, the first video signal modulated at the first clock falling edge, the second video signal is modulated at the second clock falling edge, the third video signal is modulated at the third clock falling edge, the fourth video signal is modulated at the fourth clock falling edge, the first video signal is modulated at the fifth clock falling edge . . . , and so on.

In this disclosure, the at least two video signals may be two video signals, four video signals, six video signals, etc., or three video signals, five video signals, seven video signals, etc. The present disclosure does not specifically limit the number of video signals. For example, when a double-edge sampling mode is used, in three video signals after the byte size adjustment, one of the video signals is modulated at the clock rising edges, and the other two of the video signals are alternately modulated at the clock falling edges; or, two of the video signals are alternately modulated at the clock rising edges, and the other one of the video signals is modulated at the clock falling edges. In addition, with regard to the manner of modulating at least two video signals, those skilled in the art may appropriately adjust or specifically limit according in experience or specific applications.

The byte size adjustment is performed on the at least two video signals. The byte size of the at least two video signals whose byte sizes are adjusted within a unit time duration is the target byte size, that is, the at least two video signals whose byte size are adjusted conform to the predetermined clock frequency of the target signal interface. Therefore, the bytes corresponding to the at least two video signals whose byte sizes are adjusted may be compositely modulated to obtain composite-modulated data, and the composite-modulated data is output through the target signal interface of the analog-to-digital conversion chip. Correspondingly, the SOC chip, after receiving the composite-modulated data through its own target signal interface, may single-edge or double-edge sample the received composite-modulated data, to obtain at least two video signals whose byte sizes are adjusted. Further the SOC chip may perform signal stripping on the adjusted at least two video signals according to the multiplier point mode corresponding to each thereof, to obtain at least two video signals before the byte size adjustment, wherein a data amount for each sampling is 8 bits, i.e., 1 byte.

In an example, because a multiplier point mode of a video signal is related to a signal format, the analog-to-digital conversion chip, when modulating at least two video signals, may write the correspondence between a display channel and a signal format of the at least two video signals in its own register. As such, the SOC chip, after determining the display channel of the video signals, may determine the format corresponding to the video signals to complete data stripping.

Those skilled in the art may understand that digital signal transmission protocols such as BT656 and BT1120 stipulate that each row of valid data in a video frame starts with an effective start bit SAV, and ends with an effective stop bit EAV. For example, a format of the SAV is four bytes: FF 00 00 XY. When the SOC chip recognizes the four bytes of the SAV, it is regarded as a start of a row of valid data. For the four bytes of the SAV, the first three bytes have fixed values, and the fourth byte is programmable. Therefore, in some examples of the present disclosure, display channel identifiers of display channels corresponding to video signals are written respectively to the fourth byte at an effective start bit at a clock edge where they are, so that the SOC chip may obtain the display channel identifiers corresponding to the video signals by parsing two types of the fourth byte, so as to determine a multiplier point mode corresponding to each video signal based on a signal format determined by the display channel identifiers.

Figure 1B:
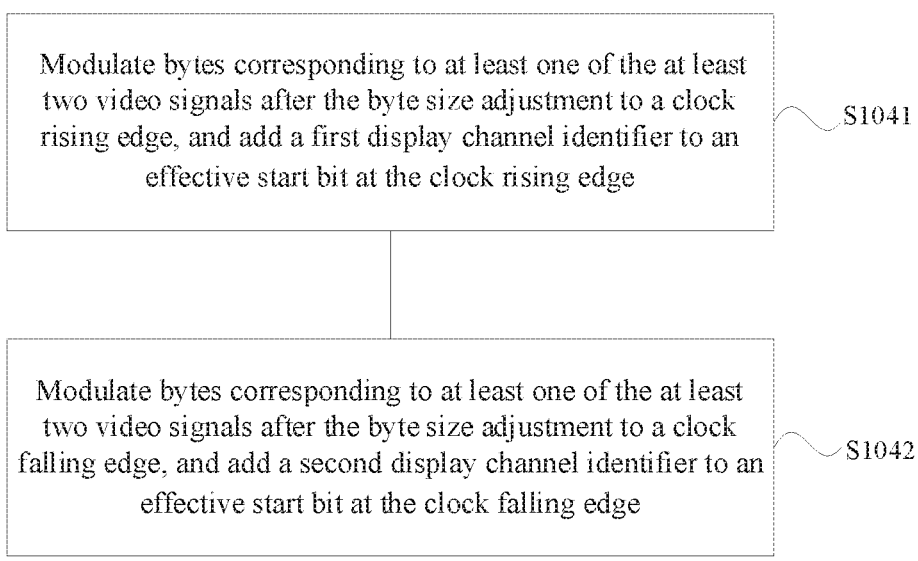

Specifically, as shown in FIG. 1B, the step S104 of composite modulation on the bytes corresponding to the at least two video signals after the byte size adjustment may include the following steps S1041 to S1042.

At step S1041, bytes corresponding to at least one of the at least two video signals after the byte size adjustment are modulated at a clock rising edge, and a fast display channel identifier is added to an effective start bit at the clock rising edge, for example, the fourth byte at the effective start bit, wherein the first display channel identifier is a display channel identifier corresponding to the video signal modulated at the clock rising edge.

At step S1042, bytes corresponding to at least one of the at least two video signals after the byte size adjustment are modulated at a clock falling edge, and a second display channel identifier is added to an effective start bit at the clock falling edge, for example, the fourth byte at the effective start bit. The second display channel identifier is a display channel identifier corresponding to the video signal modulated at the clock falling edge.

The specific format of the display channel identifiers may be set according to actual conditions, and is not limited in the examples of the present disclosure.

In the method of compositing the video signals provided by the examples of the present disclosure, the byte size adjustment is performed on the at least two video signals to be composited respectively according to the multiplier point mode corresponding to each of the at least two video signals, so that data amounts of the at least two video signals conform to single-edge sampled data amounts corresponding to the working clock frequency of the target signal interface. Composite modulation is performed on each bytes corresponding to the at least two video signals after the byte size adjustment, and the composite-modulated data is output through the target signal interface of the analog-to-digital conversion chip, so that simultaneous transmission is achieved. Therefore, this method can solve the problem that the interface for transmitting the digital video streams, for example, in a data format of YCbCr, cannot simultaneously transmit video signals with different clock frequencies in the related art, improving the flexibility of video signal transmission.

In the second aspect, based on the method of compositing the video signals, a method of stripping a composite video signal is provided according to some examples of the present disclosure, to effectively separate the composite video signal transmitted through an interface for transmitting digital video streams.

In some examples of the present disclosure, the method of stripping the composite video signal is applied to an SOC chip in an electronic device. The SOC chip is configured with a target signal interface. The target interface is an interface for transmitting digital video streams. A working clock frequency of the target signal interface is a predetermined clock frequency. A target byte size is single-edge sampled at the predetermined clock frequency. In specific applications, the SOC chip may be a DSP (Digital Signal Process) chip, or an ARM (Advanced RISC Machine) chip, and it is not limited thereto. The ARM chip is the first RISC (Reduced Instruction Set Computer) microprocessor with low power consumption cost designed by British Acorn Co., Ltd. In specific applications, the target signal interface may be a BT656 interface or a BT1120 interface, and it is not limited thereto.

The predetermined clock frequency for the target signal interface of the SOC chip is the same as the predetermined clock frequency for the target signal interface of the analogto-digital conversion chip. In specific applications, the predetermined clock frequency may be 148.5 MHz, that is, a single-edge sampled data amount is 148.5 MHz, and it is not limited thereto.

Figure 2A:
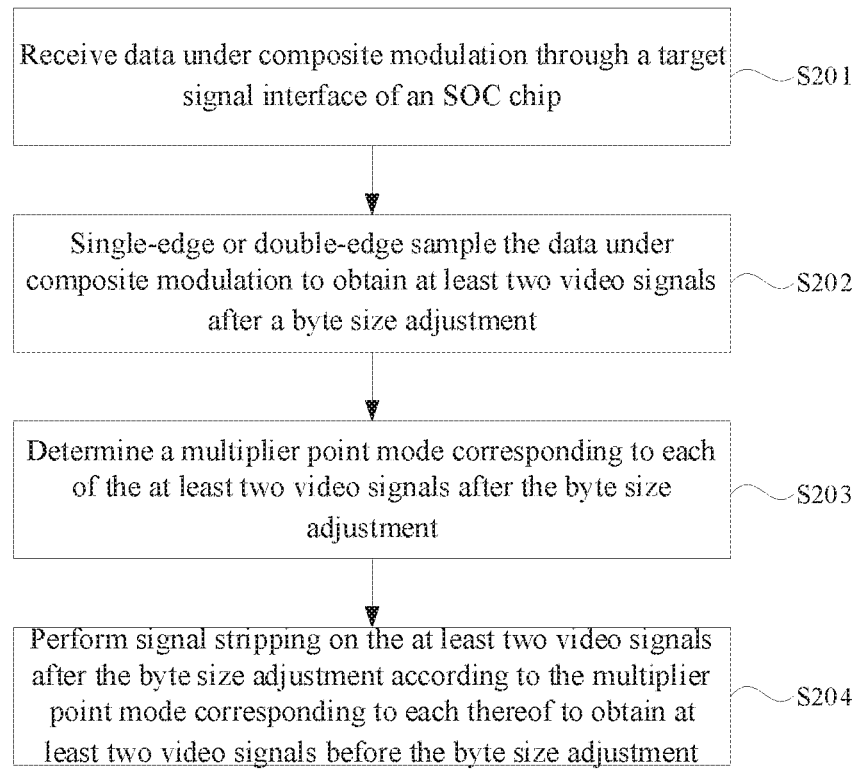
FIG. 2A is a flowchart illustrating a method of stripping a composite video signal according to an example of the present disclosure.

As shown in FIG. 2A, a method of stripping a composite video signal provided by some examples of the present disclosure may include the following steps S201 to S204.

At step S201, composite-modulated data is received through a target signal interface of an SOC chip.

The composite-modulated data is obtained after an analog-to-digital conversion chip of an electronic device performs a composite modulation on at least two video signals using the method of compositing the video signals according to some examples of the present disclosure.

At step S202, the composite-modulated data single-edge or double-edge sampled to obtain at least two video signals after the byte size adjustment.

After the composite-modulated data is received, the composite-modulated data may be single-edge or double-edge sampled. That is, the composite-modulated data may be sampled at a clock rising edge and a clock falling edge. At least one video signal after the byte size adjustment is obtained by sampling at the clock rising edge. At least the other video signal after the byte size adjustment is obtained by sampling at the clock falling edge. In addition, a data amount of 8 bits, i.e., 1 byte, is sampled each time.

At step S203, a multiplier point mode corresponding to each of the at least two video signals after the byte size adjustment is determined.

After the at least two video signals whose byte sizes are adjusted are obtained by sampling, since they need to be restored, the multiplier point mode corresponding to each of the at least two video signals whose byte sizes are adjusted may be determined. Further, signal stripping is performed on the at least two video signals whose byte sizes are adjusted according to the determined multiplier point mode.

Figure 2B:
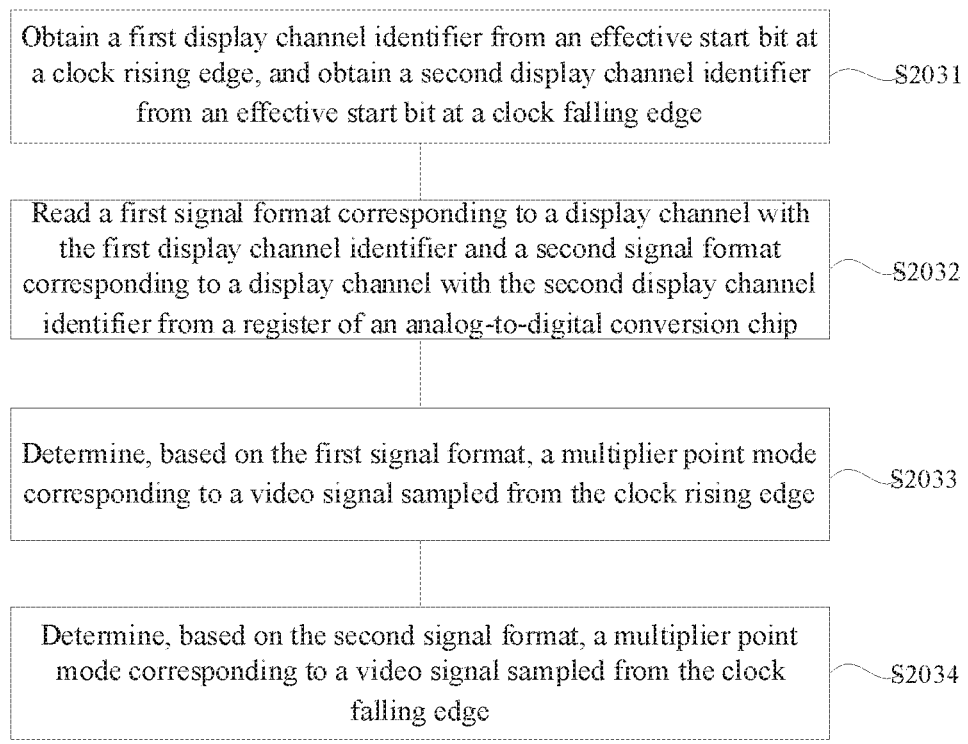
FIG. 2B is a flowchart illustrating a method of stripping a composite video signal according to an example of the present disclosure.

Specifically, as shown in FIG. 2B, the step S203 of determining the multiplier point mode corresponding to each of the at least two video signals after the byte size adjustment may include the following steps S2031 to S2032.

At step S2031, a first display channel identifier obtained from an effective start bit at a clock rising edge, and a second display channel identifier is obtained from an effective start bit at a clock falling edge.

At step S2032, a first signal format corresponding to a display channel with the first display channel identifier and a second signal format corresponding to a display channel with the second display channel identifier are read from a register of an analog-to-digital conversion chip.

At step S2033, a multiplier point mode corresponding to a video signal sampled from the clock rising edge is determined based on the first signal format.

At step S2034, a multiplier point mode corresponding to a video signal sampled from the clock falling edge is determined based on the second signal format.

Since the register of the analog-to-digital conversion chip stores a format of a video signal in each display channel, and a multiplier point mode of the video signal is related to the signal format, a signal format corresponding to a display channel with corresponding display channel identifier may be determined based on two display channel identifiers in the fourth byte at an effective start bit, and further, a multiplier point mode is determined based on the determined signal format.

In addition, the SOC chip may pre-store the correspondence between a signal format and a multiplier point mode, so that after the format of a video signal is determined, a multiplier point mode corresponding to the video signal may be determined directly according to the correspondence between the signal format and the multiplier point mode.

At step S204, signal stripping is performed on the at least two video signals after the byte size adjustment according to the multiplier point mode corresponding to each thereof to obtain at least two video signals before the byte size adjustment.

For a video signal with a multiplier point mode being a one-fold multiplier point, since a byte size adjustment does not substantially occur, the video signal after the byte size adjustment may be used directly as a video signal before the byte size adjustment. For a video signal with a multiplier point mode being a two-fold multiplier point, the so-called stripping is: capturing one of every two identical bytes from the video signal after the byte size adjustment, and using the captured byte as a byte of the video signal before the byte size adjustment. For a video signal with a multiplier point mode being a four-fold multiplier point, the so-called stripping is: capturing one of every four identical bytes from the video signal after the byte size adjustment, and using the captured byte as a byte of the video signal before the byte size adjustment, and so on.

For example, the order before adjusting a byte size according to a two-fold multiplier point is: Cr1 Y1 Cr1 Y2 Cb2 Y3 Cr2 Y4 . . . , and so on; the order after adjusting the byte size according to the two-fold multiplier point is: Cb1 Cb1 Y1 Y1 Cr1 Cr1 Y2 Y2 Cb2 Cb2 Y3 Y3 Cr2 Cr2 Y4 Y4 . . . , and so on.

Here, the SOC chip needs only to capture one of every two bytes to complete stripping on a valid data signal.

For another example, the order before adjusting a byte size according to a four-fold multiplier point is: Cb1 Y1 Cr1 Y2 Cb2 . . . , and so on; the order after adjusting the byte size according to the four-fold multiplier point Cb1 Cb1 Cb1 C1 Y1 Y1 Y1 Y1 Cr1 Cr1 Cr1 Cr1 Y2 Y2 Y2 Y2 Cb2 Cb2 Cb2 Cb2 . . . , and so on. Here, the SOC chip needs only to capture one of every four bytes to complete stripping on a valid data signal.

In the method of stripping the composite video signal provided by some examples of the present disclosure, the composite-modulated data received through the target signal interface is single-edge or double-edge sampled, the signal stripping is performed on the at least two video signals after the byte size adjustment according to the multiplier point mode corresponding to each thereof, to restore the video signals before the byte size adjustment. Therefore, this method can effectively separate the composite video signal transmitted through the interface for transmitting the digital video streams.

Figure 3:
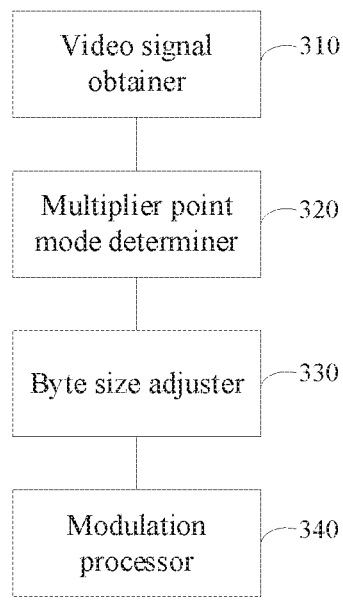
FIG. 3 is a schematic structural diagram illustrating an apparatus for compositing video signals according to an example of the present disclosure.

In the third aspect, corresponding to the method of compositing the video signals provided in the above examples, some examples of the present disclosure also provide an apparatus for compositing video signals, which is applied to an analog-to-digital conversion chip in an electronic device. The analog-to-digital conversion chip is configured with a target signal interface. The target signal interface is an interface for transmitting digital video streams. A working clock frequency of the target signal interface is a predetermined clock frequency. A target byte size is single-edge sampled at the predetermined clock frequency. As shown in FIG. 3, the apparatus includes a video signal obtainer 310, a multiplier point mode determiner 320, a byte size adjuster 330 and a modulation processor 340.

The video signal obtainer 310 is configured to obtain at least two video signals to be composited.

The multiplier point mode determiner 320 is configured to determine a multiplier point mode corresponding to each of the at least two video signals, wherein a multiplier point mode corresponding to any video signal enables the video signal to have a target byte size within a unit time duration.

The byte size adjuster 330 is configured to perform a byte size adjustment on the at least two video signals respectively according to the multiplier point mode corresponding to each of the at least two video signals.

The modulation processor 340 is configured to perform a composite modulation on bytes corresponding to at least two video signals whose byte size are adjusted, and output composite-modulated data through the target signal interface of the analog-to-digital conversion chip.

In the apparatus of compositing the video signals provided by some examples of the present disclosure, the byte size adjustment is performed on the at least two video signals to be composited respectively according to the multiplier point mode corresponding to each of the at least two video signals, so that data amounts of the at least two video signals conform to single-edge sampled data amounts corresponding to the working clock frequency of the target signal interface. The bytes corresponding to the at least two video signals after the byte size adjustment are compositely modulated, and the composite-modulated data is output through the target signal interface of the analog-to-digital conversion chip, so that simultaneous transmission is achieved. Therefore, the problem that the interface for transmitting the digital video streams can be solved, for example, in a data format of YCbCr, cannot simultaneously transmit video signals with different clock frequencies in the related art, improving the flexibility at video signal transmission.

In an example, the modulation processor 340 is configured to:

modulate bytes corresponding to at least one of the at least two video signals after the byte size adjustment at a clock rising edge, and add a first display channel identifier to an effective start bit at the clock rising edge, wherein the first display channel identifier is a display channel identifier corresponding to the video signal modulated at the clock rising edge;

modulate bytes corresponding to at least one of the at least two video signals after the byte size adjustment at a clock falling edge, and add a second display channel identifier to an effective start bit at the clock falling edge, wherein the second display channel identifier is a display channel identifier corresponding to the video signal modulated at the clock falling edge.

In an example, the multiplier point mode determiner 320 is configured to: obtain the multiplier point mode corresponding to each of the at least two video signals based on a signal format corresponding to the at least two video signals.

Figure 4:
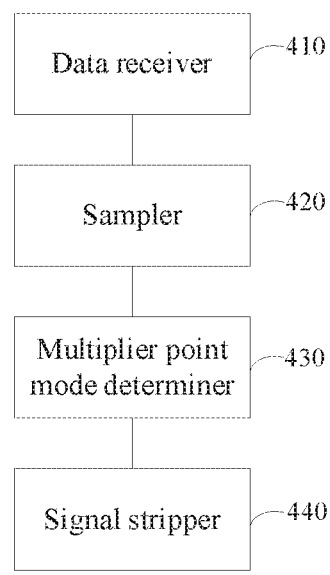
FIG. 4 is a schematic structural diagram illustrating an apparatus for stripping a composite video signal according to an example of the present disclosure.

In the fourth aspect, corresponding to the method of stripping a composite video signal, some examples of the present disclosure also provide an apparatus for stripping a composite video signal, which is applied to an SOC chip in an electronic device. The SOC chip is configured with a target signal interface. The target signal interface is an interface for transmitting digital video streams. A working clock frequency of the target signal interface is a predetermined clock frequency. A target byte size is single-edge sampled at the predetermined clock frequency. As shown in FIG. 4, the apparatus may include a data receiver 410, a sampler 420, a multiplier point mode determiner 430 and a signal stripper 440.

The data receiver 410 is configured to receive composite-modulated data through a target signal interface of an analog-to-digital conversion chip, wherein the composite-modulated data is obtained after the analog-to-digital conversion chip in the electronic device performs a composite modulation on at least two video signals using a method of compositing video signals provided in the examples of the present disclosure.

The sampler 420 is configured to single-edge or double-edge sample the composite-modulated data to obtain at least two video signals after a byte size adjustment.

The multiplier point mode determiner 430 is configured to determine a multiplier point mode corresponding to each of the at least two video signals after the byte size adjustment.

The signal stripper 440 is configured to perform signal stripping on the at least two video signals after the byte size adjustment according to the multiplier point mode corresponding to each thereof to obtain at least two video signals before the byte size adjustment.

In the apparatus of stripping a composite video signal provided by some examples of the present disclosure, the composite-modulated data received through the target signal interface is single-edge or double-edge sampled, the signal stripping is performed on the at least two video signals after the byte size adjustment according to the multiplier point mode corresponding to each thereof, to restore the video signals before the byte size adjustment. Therefore, the composite video signal transmitted through the interface for transmitting the digital video streams can be effectively separated.

In an example, the multiplier point mode determiner 430 is configured to:

obtain a first display channel identifier from an effective start bit at a clock rising edge, and obtain a second display channel identifier from an effective start bit at a clock falling edge;

read a first signal format corresponding to a display channel with the first display channel identifier and a second signal format corresponding to a display channel with the second display channel identifier from a register of an analog-to-digital conversion chip;

determine, based on the first signal format, a multiplier point mode corresponding to a video signal sampled from the clock rising edge;

determine, based on the second signal format, a multiplier point mode corresponding to a video signal sampled from the clock falling edge.

Figure 5:
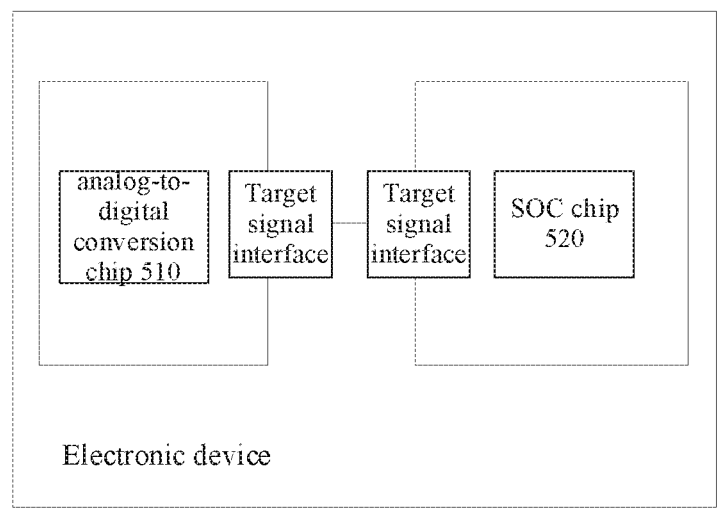
FIG. 5 is a schematic structural diagram illustrating an electronic device according to an example of the present disclosure.

In the fifth aspect, some examples of the present disclosure also provide an electronic device. As shown in FIG. 5, the electronic device includes: an analog-to-digital conversion chip 510 and a system-on-chip SOC chip 520, wherein both of the analog-to-digital conversion chip 510 and the SOC chip 520 are configured with a target signal interface, the target signal interface is an interface for transmitting digital video streams, a working clock frequency of the target signal interface is a predetermined clock frequency, and a target byte size is single-edge sampled at the predetermined clock frequency.

The analog-to-digital conversion chip 510 is configured to obtain at least two video signals to be composited, determine a multiplier point mode corresponding to each of the at least two video signals, wherein a multiplier point mode corresponding to any video signal enables the video signal to have a target byte size within a unit time duration, perform a byte size adjustment on the at least two video signals respectively according to the multiplier point mode corresponding to each of the at least two video signals, perform a composite modulation on bytes corresponding to at least two video signals after the byte size adjustment, and output composite modulated data to the system-on-chip SOC chip through the target signal interface of the analog-to-digital conversion chip.

The SOC chip 520 is configured to receive the composite-modulated data through its own target signal interface, single-edge or double-edge sample the data to obtain the at least two video signals after the byte size adjustment, determine a multiplier point mode corresponding to each of the at least two video signals after the byte size adjustment, and perform signal stripping on the two video signals after the byte size adjustment according to the multiplier point mode corresponding to each thereof to obtain at least two video signals before the byte size adjustment.

Therefore, this electronic device can solve the problem that the interface for transmitting the digital video streams, for example, in a data format of YCbCr, cannot simultaneously transmit video signals with different clock frequencies in the related art, and can effectively separate the composite video signal transmitted through the interface for transmitting the digital video streams.

In an example, the step that the analog-to-digital conversion chip 510 performing a composite modulation on the bytes corresponding to the at least two video signals after the byte size adjustment includes: modulating bytes corresponding to at least one of the at least two video signals after the byte size adjustment at a clock rising edge, and adding a first display channel identifier to an effective start bit at the clock rising edge, wherein the first display channel identifier display channel identifier corresponding to the video signal modulated at the clock rising edge; modulating bytes corresponding to at least the other one of the at least two video signals after the byte size adjustment at a clock falling edge, and adding a second display channel identifier to an effective start bit at the clock falling edge, wherein the second display channel identifier is a display channel identifier corresponding to the video signal modulated at the clock falling edge.

In an example, the step of the analog-to-digital conversion chip 510 determining the multiplier point mode corresponding to each of the at least two video signals includes: obtaining the multiplier point mode corresponding to each of the at least two video signals based on a signal format corresponding to the at least two video signals.

In an example, in a case where the at least two video signals to be composited include two video signals, the two video signals are a video signal in a 1080P25/30 fps format and a video signal in a 720P25/30 fps format, a multiplier point mode corresponding to the video signal in the 1080P25/30 fps format is a one-fold multiplier point, and a multiplier point mode corresponding to the video signal in the 720P25/30 fps format is a two-fold multiplier point; or the two video signals are a video signal in a 1080P25/30 fps format and a video signal in a WD1-NTSC/PAL format, a multiplier point mode corresponding to the video signal in the 1080P25/30 fps format is a one-fold multiplier point, and a multiplier point mode corresponding to the video signal in the WD1-NTSC/PAL format is a four-fold multiplier point; or the two video signals are a video signal in a 720P25/30 fps format and a video signal in a WD1-NTSC/PAL format, a multiplier point mode corresponding to the video signal in the 720P25/30 fps format is a two-fold multiplier point, and a multiplier point mode corresponding to the video signal in the WD1-NTSC/PAL format is a four-fold multiplier point.

In an example, the step of the SOC chip 520 determining the multiplier point mode corresponding to each of the at least two video signals after the byte size adjustment may include: obtaining a first display channel identifier from an effective start bit at a clock rising edge, and obtaining a second display channel identifier from an effective start bit at a clock falling edge; reading a first signal format corresponding to a display channel with the first display channel identifier and a second signal format corresponding to a display channel with the second display channel identifier from a register of an analog-to-digital conversion chip; determining, based on the first signal format, a multiplier point mode corresponding to a video signal sampled from the clock rising edge; determining, based on the second signal format, a multiplier point mode corresponding to a video signal sampled from the clock falling edge.

For the electronic device examples, since they basically correspond to the method examples and the apparatus examples, reference may be made to the partial description of the method examples and the apparatus examples.

For the implementation process of functions and roles of units in the above apparatus, please refer to the implementation process of corresponding steps in the above method for details, which will not be repeated here.

For the apparatus examples, since they basically correspond to the method examples, reference may be made to the partial description of the method examples. The apparatus examples described above are merely illustrative, wherein the units described as separate components may or may not be physically separated, and the components displayed as units may or may not be physical units, i.e., may be located in one place or may be distributed to multiple network units. Some or all of the modules may be selected according to actual needs to achieve the objectives of the present disclosure. Those of ordinary skill in the art can understand and implement the present disclosure without any creative effort.

The above are only preferred examples of the present disclosure, and are not intended to limit the present disclosure. Any modification, equivalent replacement, improvement, etc. made within the spirit and principle of the present disclosure shall be included within the protection scope of the present disclosure.

The invention claimed is:
1. A method comprising:
obtaining, by an analog-to-digital conversion chip in an electronic device, at least two video signals to be composited, wherein the analog-to-digital conversion chip is configured with a target signal interface configured to transmit digital video streams, wherein a working clock frequency of the target signal interface is a predetermined clock frequency, and a target byte size is single-edge sampled at the predetermined clock frequency; and
compositing, by the analog-to-digital conversion chip, the at least two video signals by
determining a multiplier point mode corresponding to each of the at least two video signals, wherein a multiplier point mode corresponding to each of the video signals enables the video signal to have a target byte size within a unit time duration;
performing a byte size adjustment on the at least two video signals respectively according to the multiplier point mode corresponding to each of the at least two video signals to obtain at least two video signals after the byte size adjustment; and
performing a composite modulation on bytes corresponding to the at least two video signals after the byte size adjustment to obtain composite-modulated data, and outputting the composite-modulated data through the target signal interface of the analog-to-digital conversion chip.

2. The method of claim 1, wherein performing a composite modulation on bytes corresponding to the at least two video signals after the byte size adjustment comprises:

modulating, at a clock rising edge, respective bytes corresponding to at least one of the at least two video signals after the byte size adjustment, and adding a first display channel identifier to an effective start bit at the clock rising edge, wherein the first display channel identifier is a display channel identifier corresponding to the video signal modulated at the clock rising edge; and modulating, at a clock falling edge, respective bytes corresponding to at least one of the at least two video signals after the byte size adjustment, and adding a second display channel identifier to an effective start bit at the clock falling edge, wherein the second display channel identifier is a display channel identifier corresponding to the video signal modulated at the clock falling edge.

3. The method according to claim 2, wherein determining the multiplier point mode corresponding to each of the at least two video signals comprises:

obtaining the multiplier point mode corresponding to each of the at least two video signals based on a signal format corresponding to each of the at least two video signals.

4. The method according to claim 2, wherein the at least two video signals to be composited comprise two video signals including one of:

a video signal in a 1080P25/30 fps format and a video signal in a 720P25/30 fps format, a multiplier point mode corresponding to the video signal in the 1080P25/30 fps format is a one-fold multiplier point, and a multiplier point mode corresponding to the video signal in the 720P25/30 fps format is a two-fold multiplier point;

a video signal in a 1080P25/30 fps format and a video signal in a WD1-NTSC/PAL format, a multiplier point mode corresponding to the video signal in the 1080P25/30 fps format is a one-fold multiplier point, and a multiplier point mode corresponding to the video signal in the WD1-NTSC/PAL format is a four-fold multiplier point; or a video signal in a 720P25/30 fps format and a video signal in a WD1-NTSC/PAL format, a multiplier point mode corresponding to the video signal in the 720P25/30 fps format is a two-fold multiplier point, and a multiplier point mode corresponding to the video signal in the WD1-NTSC/PAL format is a four-fold multiplier point.

5. The method according to claim 2, wherein the target signal interface comprises a BT656 interface or a BT1120 interface.

6. The method of claim 1, wherein determining the multiplier point mode corresponding to each of the at least two video signals comprises:

obtaining the multiplier point mode corresponding to each of the at least two video signals based on a signal format corresponding to each of the at least two video signals.

7. The method of claim 1, wherein the at least two video signals to be composited comprise two video signals including one of:

a video signal in a 1080P25/30 fps format and a video signal in a 720P25/30 fps format, a multiplier point mode corresponding to the video signal in the 1080P25/30 fps format is a one-fold multiplier point, and a multiplier point mode corresponding to the video signal in the 720P25/30 fps format is a two-fold multiplier point;

a video signal in a 1080P25/30 fps format and a video signal in a WD1-NTSC/PAL format, a multiplier point mode corresponding to the video signal in the 1080P25/30 fps format is a one-fold multiplier point, and a multiplier point mode corresponding to the video signal in the WD1-NTSC/PAL format is a four-fold multiplier point; or a video signal in a 720P25/30 fps format and a video signal in a WD1-NTSC/PAL format, a multiplier point mode corresponding to the video signal in the 720P25/30 fps format is a two-fold multiplier point, and a multiplier point mode corresponding to the video signal in the WD1-NTSC/PAL format is a four-fold multiplier point.

8. The method of claim 1, wherein the target signal interface comprises a BT656 interface or a BT1120 interface.

9. The method of claim 1, wherein the at least two video signals after the byte size adjustment comprise one of:

at least one video signal modulated at a clock rising edge and at least one video signal modulated at a clock falling edge;

at least two of the video signals alternately modulated at a clock rising edge; or at least two of the video signals alternately modulated at a clock falling edge.

10. The method of claim 1, further comprising:

stripping, by a system-on-chip (SOC) chip in the electronic device, a composite video signal, wherein the SOC chip is configured with a second target signal interface configured for transmitting second digital video streams, and wherein a second working clock frequency of the second target signal interface is a second predetermined clock frequency, and a second target byte size is single-edge sampled at the second predetermined clock frequency, wherein stripping a composite video signal comprising:

receiving the composite-modulated data through the second target signal interface;

sampling, in manner of single-edge or double-edge, the data to obtain at least two particular video signals after second byte size adjustment;

determining a multiplier point mode corresponding to each of the at least two particular video signals after the second byte size adjustment; and performing signal stripping on the at least two particular video signals after the second byte size adjustment according to the second multiplier point mode corresponding to each of the at least two particular video signals to obtain the at least two video signals before the first byte size adjustment.

11. The method of claim 10, wherein determining the multiplier point mode corresponding to each of the at least two particular video signals after the second byte size adjustment comprises:
   obtaining a first display channel identifier from an effective start bit at a clock rising edge, and obtaining a second display channel identifier from an effective start bit at a clock falling edge;
   reading a first signal format corresponding to a display channel with the first display channel identifier and a second signal format corresponding to a display channel with the second display channel identifier from a register of the analog-to-digital conversion chip;
   determining, based on the first signal format, a multiplier point mode corresponding to a video signal sampled from the clock rising edge; and
   determining, based on the second signal format, a multiplier point mode corresponding to a video signal sampled from the clock falling edge.

12. An apparatus comprising:
   an analog-to-digital conversion chip for compositing video signals; and
   a target signal interface configured with the analog-to-digital conversion chip, wherein the target signal interface is configured to transmit digital video streams, and wherein a working clock frequency of the target signal interface is a predetermined clock frequency, and a target byte size is single-edge sampled at the predetermined clock frequency,
   wherein the analog-to-digital conversion chip comprises:
      a video signal obtainer configured to obtain at least two video signals to be composited;
      a multiplier point mode determiner configured to determine a multiplier point mode corresponding to each of the at least two video signals, wherein a multiplier point mode corresponding to each of the video signals enables the video signal to have a target byte size within a unit time duration;
      a byte size adjuster configured to perform a byte size adjustment on the at least two video signals respectively according to the multiplier point mode corresponding to each of the at least two video signals to obtain at least two video signals after the byte size adjustment; and
      a modulation processor configured to perform a composite modulation on bytes corresponding to the at least two video signals after the byte size adjustment to obtain composite-modulated data, and output the composite-modulated data through the target signal interface of the analog-to-digital conversion chip.

13. The apparatus of claim 12, wherein the modulation processor is configured to:
   modulate respective bytes corresponding to at least one of the at least two video signals after the byte size adjustment at a clock rising edge, and add a first display channel identifier to an effective start bit at the clock rising edge, wherein the first display channel identifier is a display channel identifier corresponding to the video signal modulated at the clock rising edge; and
   modulate respective bytes corresponding to at least one of the at least two video signals after the byte size adjustment at a clock falling edge, and add a second display channel identifier to an effective start bit at the clock falling edge, wherein the second display channel identifier is a display channel identifier corresponding to the video signal modulated at the clock falling edge.

14. The apparatus of claim 13, wherein the multiplier point mode determiner is configured to obtain the multiplier point mode corresponding to each of the at least two video signals based on a signal format corresponding to each of the at least two video signals.

15. The apparatus of claim 12, wherein the multiplier point mode determiner is configured to obtain the multiplier point mode corresponding to each of the at least two video signals based on a signal format corresponding to each of the at least two video signals.

16. The apparatus of claim 12, further comprising:
   a system-on-chip (SOC) chip for stripping a composite video signal; and
   a second target signal interface configured with the SOC chip, wherein the second target signal interface is configured to transmit second digital video streams, and wherein a second working clock frequency of the second target signal interface is a second predetermined clock frequency, and a second target byte size is single-edge sampled at the second predetermined clock frequency,
   wherein the SOC chip comprises:
      a data receiver configured to receive the composite-modulated data through the second target signal interface;
      a sampler configured to single-edge or double-edge sample the data to obtain at least two particular video signals after second byte size adjustment;
      a second multiplier point mode determiner configured to determine a multiplier point mode corresponding to each of the at least two particular video signals after the second byte size adjustment; and
      a signal stripper configured to perform signal stripping on the at least two particular video signals after the second byte size adjustment according to the multiplier point mode corresponding to each of the at least two particular video signals to obtain the at least two video signals before the first byte size adjustment.

17. The apparatus of claim 16, wherein the second multiplier point mode determiner is configured to:
   obtain a first display channel identifier from an effective start bit at a clock rising edge, and obtain a second display channel identifier from an effective start bit at a clock falling edge;
   read a first signal format corresponding to a display channel with the first display channel identifier and a second signal format corresponding to a display channel with the second display channel identifier from a register of the analog-to-digital conversion chip;
   determine, based on the first signal format, a multiplier point mode corresponding to a video signal sampled from the clock rising edge; and
   determine, based on the second signal format, a multiplier point mode corresponding to a video signal sampled from the clock falling edge.

18. An electronic device, comprising:
   an analog-to-digital conversion chip, configured with a first target signal interface for transmitting first digital video streams, wherein a first working clock frequency of the first target signal interface is a first predetermined clock frequency, and a first target byte size is single-edge sampled at the first predetermined clock frequency; and
   a system-on-chip (SOC) chip, configured with a second target signal interface for transmitting second digital video streams, wherein a second working clock frequency of the second target signal interface is a second predetermined clock frequency, and a second target byte size is single-edge sampled at the second predetermined clock frequency;

wherein the analog-to-digital conversion chip is configured to:
  obtain at least two video signals to be composited,
  determine a multiplier point mode corresponding to each of the at least two video signals, wherein a multiplier point mode corresponding to at least one of the at least two video signals enables the video signal to have a target byte size within a unit time duration,
  perform a first byte size adjustment on the at least two video signals respectively according to the multiplier point mode corresponding to each of the at least two video signals to obtain at least two video signals after the first byte size adjustment,
  perform a composite modulation on bytes corresponding to the at least two video signals after the byte size adjustment to obtain composite-modulated data, and
  output the composite-modulated data to the SOC chip through the first target signal interface, and wherein the SOC chip is configured to:
  receive the composite-modulated data through the second target signal interface,
  single-edge or double-edge sample the composite-modulated data to obtain the at least two particular video signals after second byte size adjustment,
  determine a multiplier point mode corresponding to each of the at least two particular video signals after the second byte size adjustment, and
  perform signal stripping on the at least two particular video signals after the second byte size adjustment according to the multiplier point mode corresponding to each of the at least two particular video signals to obtain the at least two video signals before the first byte size adjustment.

* * * * *